(12) United States Patent
Balzano

(10) Patent No.: US 7,764,494 B2
(45) Date of Patent: Jul. 27, 2010

(54) LIQUID COOLED MODULE

(75) Inventor: Alfiero Balzano, Garden Grove, CA (US)

(73) Assignee: Basic Electronics, Inc., Garden Grove, CA (US)

( * ) Notice: Subject to any disclaimer, the term of this patent is extended or adjusted under 35 U.S.C. 154(b) by 63 days.

(21) Appl. No.: 11/986,170

(22) Filed: Nov. 20, 2007

(65) Prior Publication Data

US 2009/0129011 A1    May 21, 2009

(51) Int. Cl.
    *H05K 7/20*    (2006.01)
(52) U.S. Cl. .................. 361/689; 361/699; 361/704; 361/705; 165/80.4; 165/104.22; 257/714
(58) Field of Classification Search ......... 361/688–692, 361/697–704, 735, 752; 165/104.22, 104.33, 165/80.4, 80.5, 104.59, 126, 135, 136, 139, 165/143, 168, 170, 174, 185; 174/15.1, 16.3, 174/252; 29/890.02, 890.03, 890.039, 840; 257/713–715, 721; 62/259.2, 3.2, 3.3
See application file for complete search history.

(56) References Cited

U.S. PATENT DOCUMENTS

| 4,551,787 | A | * | 11/1985 | Mittal et al. ................ 361/705 |
| 4,758,926 | A | * | 7/1988 | Herrell et al. ............... 361/699 |
| 4,860,444 | A | * | 8/1989 | Herrell et al. ................. 29/840 |
| 5,057,908 | A | * | 10/1991 | Weber ........................ 257/714 |
| 5,274,920 | A | * | 1/1994 | Matthews .............. 29/890.039 |
| 5,293,070 | A | * | 3/1994 | Burgess et al. .............. 257/714 |
| 6,101,715 | A | * | 8/2000 | Fuesser et al. ........... 29/890.03 |
| 6,480,385 | B2 | * | 11/2002 | Seshan ........................ 361/704 |
| 6,988,535 | B2 | * | 1/2006 | Upadhya et al. ........... 165/80.4 |

* cited by examiner

*Primary Examiner*—Michael V Datskovskiy
(74) *Attorney, Agent, or Firm*—Stetina Brunda Garred & Brucker

(57) ABSTRACT

A thermal module is provided for absorbing and dissipating heat from a heat generating component. The module comprises a module body, input and output ports, and a channel disposed within the module body. The module body includes a thermally conductive base, a top surface, and a side surface rising from the base toward the top surface. The base is disposable adjacent the heat generating component to facilitate transfer of heat from the heat generating component to the base. The input and output ports are each disposed on the side surface of the body. The channel is encapsulated within the module body and extends from the input port to the output port to define a flow path. The channel is operative to convey a cooling fluid therethrough for absorbing and dissipating the heat from the heat generating component.

18 Claims, 4 Drawing Sheets

LIQUID COOLED MODULE

CROSS-REFERENCE TO RELATED APPLICATIONS

Not Applicable

STATEMENT RE: FEDERALLY SPONSORED RESEARCH/DEVELOPMENT

Not Applicable

BACKGROUND

The present invention relates generally to thermal cooling devices, and more specifically, to a liquid cooled thermal module that is configured to be used in compact devices and that tends to mitigate any undercirculation or overcirculation of cooling fluid thereby efficiently absorbing and dissipating heat from a heat generating component.

One of the greatest challenges facing electronic technology is the effective dissipation of heat from a heat generating electronic component. As electronic components such as circuit boards and computer chips have decreased in size over the years, there has been an increased need in providing effective means for removing heat from the components. Further, many computer enthusiasts tend to overclock their computer components, which results in a large amount of heat generation. Unless the heat is effectively removed from the component, the component and the electronic system may be subject to instability and failure. Furthermore, although progress has been made in miniaturizing and improving such components, this progress has been somewhat dependent upon the thermal properties and capabilities of the component.

Heat sinks have been a common solution to the challenge of effectively dissipating heat from a heat generating electronic component. There are two fundamental considerations in designing an effective heat sink. First, a heat sink typically includes a base surface that is in substantial contact with the heat generating component in order to maximize heat conduction from the component to the heat sink. Second, the heat sink should have a large surface area in order to maximize heat transfer from the heat sink to the air via convection. In order to effectively dissipate the heat to the air, the heat sink usually includes fins. Some exemplary heat sinks are shown in FIGS. 1 and 2. As illustrated in FIG. 1, the heat sink 10 includes a base 12 and has a plurality of fins 14, such as pins, extending orthogonally from the base 12. As mentioned, the base 12 of the sink 10 provides thermal conductive contact with the heat generating component. The pins increase the overall surface area of the heat sink 10, thus enhancing the heat dissipating ability of the heat sink 10. FIG. 2 is an illustration of another heat sink 10 in which a series of spaced apart plates 16 are coupled to an orthogonally positioned with respect to as base 12. Similar to the embodiment shown in FIG. 1, the spaced apart plates 16 of the heat sink 10 in FIG. 2 serve to dissipate the heat conducted through the base 12 from the heat generating component. Other various configurations have been developed utilizing the two principle considerations discussed above.

Another important consideration when designing the heat sink is the type of material used. The heat sink should preferably be made of a material having a high thermal conductivity. Such materials include silver (429 $W \cdot m^{-1} \cdot K^{-1}$), copper (386 $W \cdot m^{-1} \cdot K^{-1}$), and aluminum (237 $W \cdot m^{-1} \cdot K^{-1}$). These materials are commonly used because they have relatively high thermal conductivities and they are readily available.

Although such heat sinks have enhanced the ability of a heat generating component to dissipate heat, other modifications to these heat sinks have been performed in order to further increase their capabilities. For example, one important development has been the practice of forced convection. This entails forcing air or other gases or fluids through the pins or spaced apart plates of the heat sink. Such methods of forced convection include the use of fans to circulate air in between the pins or spaced apart plates.

More recently, forced convection has been performed by circulating liquids such as water over the fins of the heat sink. A water-cooled thermal apparatus 18, as illustrated in FIG. 3, includes not only a heat sink 10 component with fins 14, but also includes a container 20 that fits over the heat sink 10. The container 20 includes an input port 22 and an output port 24 wherethrough a liquid may pass as, as well as input and output connectors 26, 28. The container 20 and the input and output ports 22, 24 include gasket seals 30 that create the water-tight seal due to the applied pressure of a mounting bracket 32 that fastens the apparatus to a circuit board utilizing fasteners 34. When the liquid is injected into the container 20, it absorbs the heat from the heat sink 10 and exits through the output port 24. This water cooled thermal apparatus 18, although effective, is bulky and may only be used in non-congested spaces where there is plenty of room for such a bulky apparatus. However, these water cooled thermal apparatuses 18 have several drawbacks.

Some of the limitations and drawbacks of the current water cooled thermal apparatuses include the inability to fit such apparatuses into compact computer configurations. Due to its size, the cooling system illustrated in FIG. 3 may only be used on a heat-generating component if there is sufficient space around the component within a case wherein the component is housed. For a desktop computer, more space is available and the water cooled thermal apparatus 18 of FIG. 3 can usually be accommodated. However, the integration of several circuit boards, graphic cards, or other electronic components within the desktop computer sometimes occupies more space within the case, thus making the installation of a water cooled thermal apparatus impossible. Further, because space is already so limited in a laptop computer, water cooled thermal apparatuses, such as that illustrated in FIG. 3, are too large and bulky.

In addition, as shown in FIG. 3, current water cooled thermal apparatuses 18 are not effectively designed to maximize the amount of heat transfer to a given volume of water as it passes through the apparatus. Instead, the water is simply injected into the apparatus from the input port 22 that is orthogonally disposed relative to the base 12. Upon entering, the water impinges upon the fins 14 of the base 12 and is disseminated in a random fashion therethrough. As understood, there is no apparent circulation path from the input port 22 to the output port 24. Instead, the output port 24 is also disposed orthogonally relative to the base 12 and water exits therethrough as required. The exiting water may or may not have been circulated across the fins 14. Indeed, in such a configuration, some of the water may enter, its temperature may approach its vaporization temperature, and yet remain swirling in the corners or along the edges of the base without being replaced by fresher, cooler water that will absorb more of the heat. Additionally, some of the fresher, cooler water entering through the input port may quickly exit through the output port without absorbing much heat at all. Thus, another deficiency of the prior art water cooled thermal apparatuses is the poor and inefficient circulation of water therethrough.

Therefore, despite the benefits of such water cooled thermal apparatuses, they have heretofore had limited utility in small electronic devices due to the very little extra space within the cases or housings of such devices. Considering the increasing pressure to miniaturize the electronic devices, manufacturers of such devices must find alternative means for cooling heat generating components unable to adequately dissipate heat on their own. Given the widespread use of smaller electronic devices such as PDA's, cell phones, laptop computers, etc., as well as the increasing need to enhance the capabilities of such devices, manufacturers will soon need to provide cooling systems for these smaller devices that are efficient, small, inexpensive, and reliable.

Therefore, there exists a need in the art for an effective cooling apparatus that may be used in small electronic devices. Additionally, there is a need in the art for a cooling apparatus that may be fitted into small openings or crevices within a computer and fastened to a heat generating component in order to effectively dissipate heat from the component. There is a need in the art for an inexpensive cooling apparatus that is able to effectively circulate liquid to quickly and efficiently remove heat from a heat generating component. Finally, there is a need in the art for a cooling apparatus that effectively cycles fluid therethrough to ensure that the fluid absorbs as much heat as possible before exiting the apparatus.

BRIEF SUMMARY

In order to address many of the above-mentioned drawbacks associated with the prior art, a liquid cooled thermal module is provided for absorbing and dissipating heat from a heat generating component. The teachings herein may be used for various types of electronic, mechanical, or biological applications. Therefore, specific reference to heat generating computer components is merely exemplary, and may be modified as required. Further, additional modifications and substitutions as taught herein are also provided for exemplary purposes.

The module comprises a module body, input and output ports, and a channel extending through the body. The body includes a thermally conductive base, a top surface, and a side surface rising from the base toward the top surface. The body may be shaped as a rectangular parallelepiped. The base is disposable adjacent the heat generating component to facilitate transfer of heat from the heat generating component to the base. The configuration of the base may be modified in order to accommodate cooling of variously sized components.

The input and output ports are each disposed on the side surface of the module body. These ports may accommodate input and output connectors, which may be used to attach proper tubing thereto for enabling the transfer of fluid to the input port and from the output port.

The channel extends from the input port to the output port to define a flow path. The channel includes an inlet end that is in fluid communication with the input port. The channel further includes an outlet end that is in fluid communication with the output port. The channel is encapsulated within the body intermediate the base and the top surface, and the channel is operative to convey the cooling fluid therethrough for absorbing and dissipating the heat from the heat generating component.

The flow path of the channel is preferably configured to allow a cooling fluid to circulate within the module body in order to facilitate the transfer of heat from the module to the fluid. In this regard, the flow path may be oriented parallel with respect to an upper face of the heat generating component. Further, the flow path of the channel may be curvilinear to promote smooth flow of a fluid from the input port to the output port. Additionally, the flow path of the channel may be singular. Finally, the channel may be plated with a thermally conductive material, which may enhance the transfer of heat to the fluid.

According to an inventive aspect of the present invention, the channel is preferably designed to pass the fluid therethrough such that a given control volume of fluid entering the input port of the module at a first temperature is raised to a second temperature while being conveyed through the channel toward the output port. The given control volume of fluid should reach the second temperature immediately prior to exiting the output port of the module. In this regard, the fluid is preferably uniformly heated as it passes through the module, without leaving fluid undercirculated or overcirculated, as problematic from the prior art. The first temperature of the fluid may be selected at ambient temperature or lower. Preferably, the first temperature of the fluid is much lower than the second temperature in order to maximize the heat absorption capability of the fluid. The second temperature is the temperature to which the given control volume of the fluid is raised after passing through the channel. The second temperature should preferably be less than the vaporization temperature of the fluid. In such a configuration, the fluid could consistently absorb a given amount of heat. Thus, the fluid exiting through the output port should consistently be raised to the second temperature. Optimal first and second temperatures may be determined based on the heat capacity and other characteristics of the fluid, as well as the thermal characteristics of the heat generating component.

In accordance with another aspect of the present invention, the module further comprises at least one cooling hole disposed through the top surface at least partially through the module body toward the base of the module. The cooling hole defines an interior surface. The interior surface thereof is in fluid communication with ambient air to enhance heat dissipation from the module. Further, a plurality of cooling holes may be arranged in a pattern corresponding to the flow path of the channel. In this regard, the pattern should preferably be configured with the cooling holes not intersecting with the flow path of the channel. Additionally, the cooling hole may be plated with a heat conductive material, which may also enhance the heat dissipation of the module.

According to another embodiment of the present invention, the thermal module may comprise a first subassembly, input and output ports, and a second subassembly. This embodiment permits the layerwise formation of the module. In this regard, the first subassembly includes first, second, and third layers. The second layer adhesively attaches the first layer to the third layer. The first layer defines a top surface, and the third layer includes a channel that is disposed therein. The channel may be formed in the third layer using one or many of a variety of manufacturing techniques described below. Upon formation, the channel will define a flow path and including inlet and outlet ends. The first subassembly also defines a side surface. Further, the input and output ports are disposed on the side surface of the first subassembly. The input and output ports are in fluid communication with the respective ones of the input and output ends of the channel.

Furthermore, the second subassembly includes fourth and fifth layers. The fourth layer adhesively attaches the fifth layer to the third layer of the first subassembly to encapsulate the channel thereby. The fifth layer defines a base surface. The base surface is disposable adjacent the heat generating component to facilitate transfer of the heat from the heat generating component to the fifth layer. The channel is operative to convey a cooling fluid therethrough for absorbing and dissipating the heat from the heat generating component.

As similarly mentioned above, another aspect of this embodiment is that the channel may be plated with a thermally conductive material. However, this embodiment may also allow for other modifications such as the third layer including inner and outer portions mating to define the channel therebetween. Further, the first, third, and fifth layers may each be fabricated from a single sheet of material. The single sheet of material included in the first and third layers may also be made of copper or other materials that have preferable thermal properties. Further, the single sheet of material included in the fifth layer may be made of one of polyimide and fiberglass.

In accordance with yet another embodiment of the present invention, a method of fabricating a thermal module is also provided. As described above, the module is operative to absorb and dissipate heat from a heat generating component. The method comprises: laminating first, second, and third layers to form a first subassembly, the second layer adhesively attaching the first layer to the third layer, the first layer defining a top surface, the first subassembly defining a side surface; creating a channel within the third layer, the channel defining a flow path and including inlet and outlet ends, the inlet and outlet ends intersecting with the side surface of the first subassembly to form respective ones of input and output ports, the input and output ports being in fluid communication with the respective ones of the input and output ends of the channel; and laminating fourth and fifth layers of a second subassembly to the third layer of the first subassembly, the fourth layer adhesively attaching the fifth layer to the third layer of the first subassembly to encapsulate the channel thereby.

The method may further comprise the step of drilling at least one cooling hole through the first subassembly prior to laminating the second subassembly to the third layer of the first subassembly. As mentioned above, the cooling hole should preferably not intersect with the channel. The method may also comprise the step of plating the cooling hole with a thermally conductive material. Finally, the method may also comprise the step of plating the channel with a thermally conductive material.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 4:
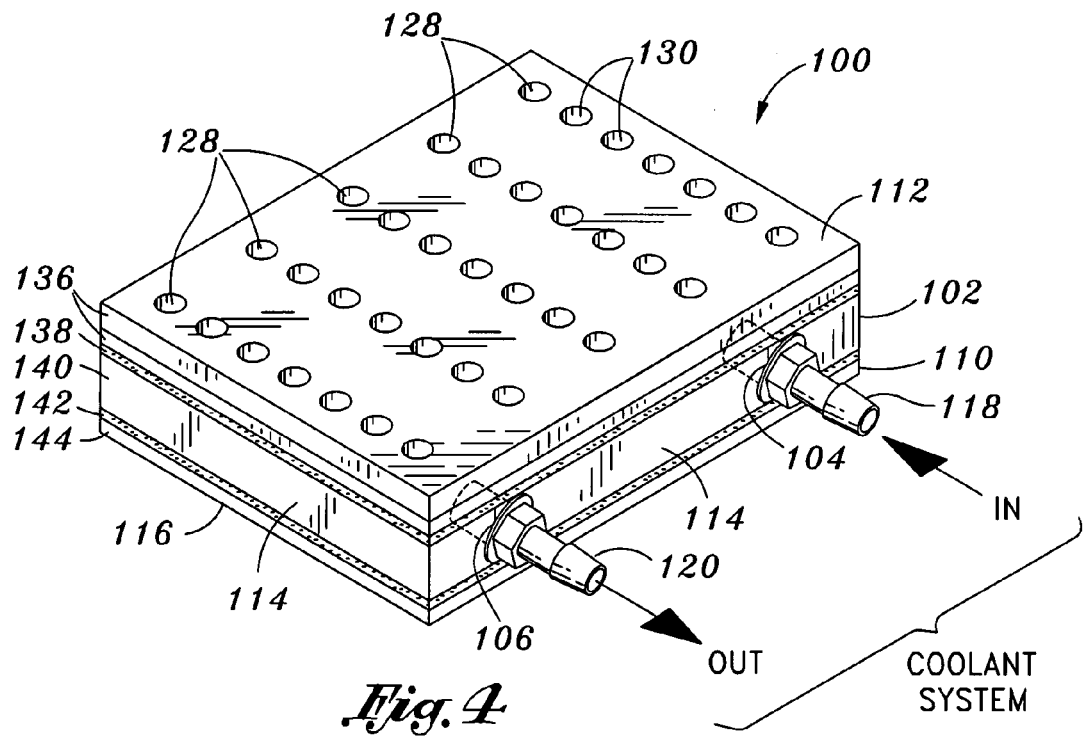
FIG. 4 is a top perspective view of an exemplary embodiment of a liquid cooled thermal module including a plurality of cooling holes and further including input and output connectors for fluidly connecting a channel disposed within the module to a coolant system according to a preferred embodiment of the present invention.

Referring now to the drawings wherein the showings are for purposes of illustrating preferred embodiments of the present invention and not for purposes of limiting the same, FIG. 4 is an exemplary embodiment of a liquid cooled thermal module 100 for absorbing and dissipating heat from a heat generating component. The module 100 is preferably sized and configured to fit in generally narrow spaces within an electronic device in order to cool components of the electronic device such as circuit boards, computer chips, and other heat generating components. The module 100 may therefore serve as a heat sink that is capable of absorbing heat from the heat generating component and removing that heat therefrom.

As will be described further herein, one of the unique advantages of embodiments of the present invention is that it may be used in compact applications or small devices requiring the rapid removal of substantial amounts of heat from a heat generating component. Such applications may include the cooling of components on small devices, such as overclocked electronic components. Another inventive aspect of embodiments of the present invention is the efficient circulation and use of cooling fluid in the module 100. As described herein, such features allow for significant advantages over prior art methods and apparatuses.

According to an aspect of the present invention, the module 100 includes a module body 102, input and output ports 104, 106, and a channel 108 extending through the body 102. The body 102 includes a thermally conductive base 110, a top surface 112, and a side surface 114 rising from the base 110 toward the top surface 112. For example, as shown in FIG. 4, the module body 102 preferably includes the top surface 112 and a base surface 116 and four sides. Thus, the module body 102 may be generally shaped as a rectangular parallelepiped. Nevertheless, the geometric configuration of the module body 102 may be one of any of a variety of geometric configurations or combinations thereof. For example, the module body 102 may also be shaped as a cylinder, a hemisphere, a cube, a pyramid, a cone, a conical frustum, or any other geometric shapes. Additionally, the configuration of the module body 102 may be specially designed depending on the application for which the module 100 may be used. As mentioned above, the module 100 is preferably configured to fit within compact spaces of an electronic device and therefore is preferably designed to fit such a compact space. In this regard, the compact space may require that the configuration of the module body 102 include a narrow width, a long length, or a specially designed surface. The configuration of the module body 102 may therefore be altered according to system requirements by one of skill in the art.

Figure 7:
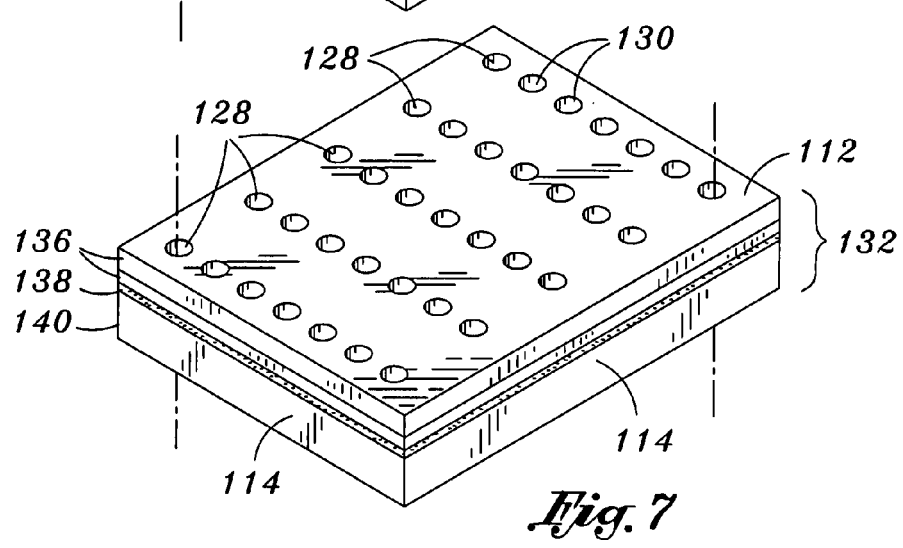
FIG. 7 is a top perspective view illustrating the layerwise configuration and fabrication of the first subassembly of the module wherein the module includes the plurality of cooling holes in accordance with an aspect of the present invention.

The base surface 116 is disposable adjacent the heat generating component to facilitate transfer of heat from the heat generating component to the base 116. The configuration of the base 110 may be variously modified in order to accommodate cooling of variously sized components. For example, the base surface 116 may be configured as a flat surface (as illustrated in FIG. 7), or may include a cavity that generally surrounds the heat generating component. Such modifications may be performed as required by the application. The base surface 116 of the module body 102 should be configured to correspond to the shape and/or configuration of the heat generating component from which the module 100 is to remove heat. For example, if the module 100 is to simply be placed on a top of the heat generating component, the base surface 116 of the module body 102 may preferably be substantially flat and smooth. As is known in the art, any imperfections in the surface of the module 100 may result in inferior heat transfer from the heat generating component to the module 100. Further, it is also contemplated that in some situations, an intermediate conductive layer, such as thermally conductive grease, may be used to enhance the thermal contact between the module 100 and the heat generating component. In addition, the face of the module 100 may also be configured to include multiple facets. For example, if the heat generating component were configured substantially as a tube or other geometric shape, the surface of the module 100 may be sized to correspond to that geometric shape. In this regard, the surface of the module 100 should be designed preferably to allow the optimal and maximum heat transfer from the heat generating component to the surface of the module 100.

Figure 3:
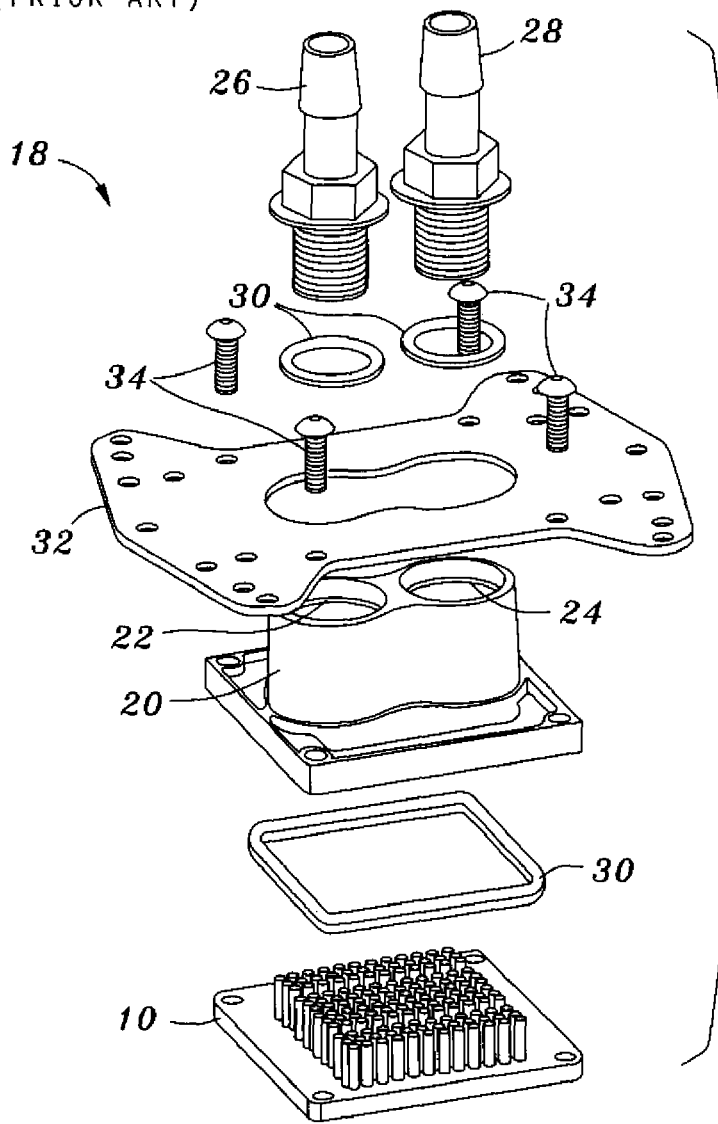
FIG. 3 is an exploded perspective view of a prior art water cooled thermal apparatus.
Figure 5:
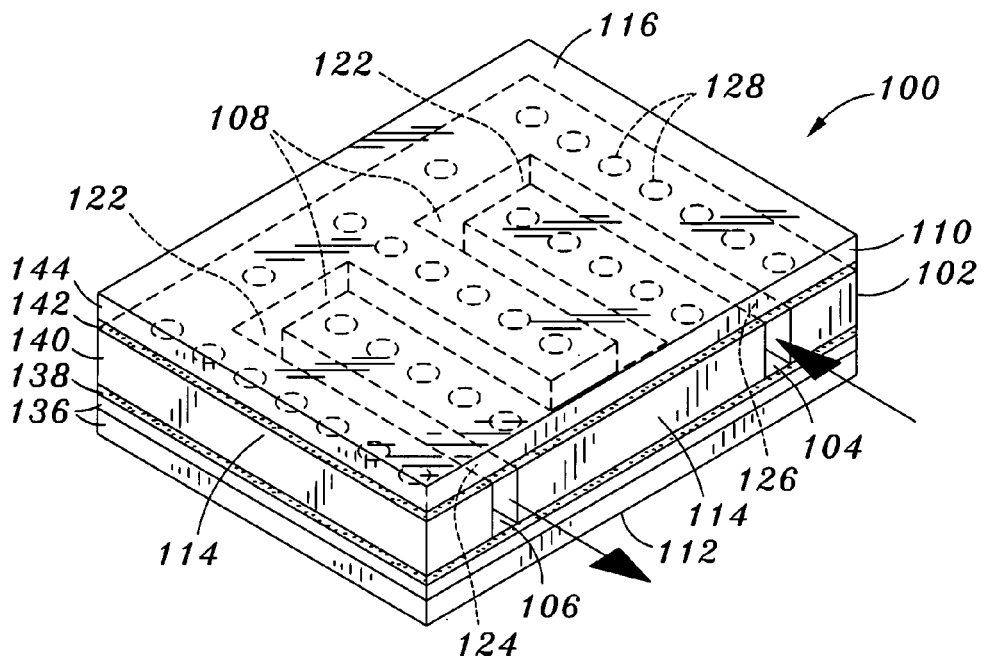
FIG. 5 is a bottom perspective view of an embodiment of the module illustrating a flow path of the channel from an input port to an output port of the module in accordance with an aspect of the present invention.

Referring to FIGS. 4 and 5, the module 100 is configured to include an input port 104, an output port 106, and at least one channel 108 being in fluid communication with the input port 104 and the output port 106. The input and output ports 104, 106 are each disposed on the side surface 114 of the module body 102. These ports 104, 106 may accommodate input and output connectors 118, 120, which may be used to attach proper tubing thereto for enabling the transfer of fluid to the input port 104 and from the output port 106. Thus, an input tube may be coupled to the input connector 118 to facilitate the delivery of fluid to the channel 108 and an output tube may be coupled to the output connector 120 in order to facilitate return of the fluid from the channel 108. As illustrated in the preferred embodiment shown in FIG. 4, the input and output ports 104, 106, which are disposed on the side surface 114 of the module body 102 with their flow path 122 being oriented orthogonally with respect to the side surface 114 of the module body 102, may provide for a generally flat configuration which may allow the module 100 to be placed in compact electronic devices. Thus, it will be noted that in contrast to the apparatus shown in FIG. 3, wherein the input and output ports 22, 24 are disposed orthogonally with respect to the base 12, embodiments of the present invention are efficiently designed with a configuration that enables the module 100 to be used in compact devices, being disposable within a generally narrow gap of a compact electronic device.

According to another inventive aspect of embodiments of the present invention, FIG. 5 illustrates, in phantom lines, the channel 108 of the module 100. As shown, the channel 108 extends from the input port 104 to the output port 106 to define a flow path 122. The channel 108 includes an inlet end 124 that is in fluid communication with the input port 104. The channel 108 further includes an outlet end 126 that is in fluid communication with the output port 106. The channel 108 is encapsulated within the body 102 intermediate the base 110 and the top surface 112, and the channel 108 is operative to convey the cooling fluid therethrough for absorbing and dissipating the heat from the heat generating component. As described herein, the channel 108 and the flow path 122 of the channel 108 may be variously configured in response to numerous considerations.

It is contemplated that the channel 108 may be configured in response to the geometry of the module 100. Some of the relevant considerations in designing the channel 108 and the configuration of the module body 102 include the desired application for which the module 100 may be used, the flow rate of the fluid through the channel 108, the required heat dissipation, the maximum operating temperature of the heat generating component, the desired temperature of the module 100, the thermal properties of the fluid used (including heat capacity, vaporization temperature, etc.), the power of the pump, and the thermal properties of the material of which the module 100 is made (such as its thermal conductivity), just to name a few.

As illustrated in FIG. 5, the flow path 122 of the channel 108 may be oriented parallel with respect to the base surface 116 of the module 100. In such an embodiment, the flow path 122 would also preferably be oriented parallel to an upper face of the heat generating component (and therefore the fluid traveling in the channel 108 would be equidistant from the heat generating component along the distance of the channel 108) when the module 100 is properly secured thereto. This feature may be incorporated into of embodiments of the present invention in order to ensure that heat flow within the module 100 is steady and uniform. Such a configuration may allow the module 100 to maintain a very narrow profile, thus enabling the module 100 to fit into tight spaces within a device, whether the device is large or small. Additionally, as described herein, the flow path 122 of the channel 108 may be correspondingly altered depending on the geometric shape of the base surface 116 and/or heat generating component.

Further, the flow path 122 of the channel 108 may be curvilinear to promote smooth flow of a fluid from the input port 104 to the output port 106. A curvilinear-shaped channel may thus allow the fluid flow through the channel 10 to be substantially laminar, thus tending to minimize a boundary layer therein that would otherwise increase due to turbulent fluid flow. This feature may allow embodiments of the present invention to thoroughly and efficiently circulate fluid through the module 100, thus allowing maximum heat transference to the fluid from the module 100. Indeed, any pockets of over-circulated fluid (which would be present in areas of turbulent flow), reduce the efficiency and effectiveness of the module 100. In order to efficiently remove heat from the module 100 the fluid entering the input port 104 of the module 100 must be at a first temperature which is less than a module temperature, which is a temperature (perhaps a minimum, average, or maximum temperature) to which the module 100 may be heated by the heat generating component. A temperature differential between the module 100 and the fluid allows the fluid to absorb heat from the module 100. The heated fluid is then evacuated from the module 100 at a second temperature (temperature of the fluid upon reaching the output port 106), which is preferably less than a vaporization temperature of the fluid. However, once the fluid reaches the module temperature, the fluid should be evacuated from the module 100. Indeed, the fluid should be selected so that its vaporization temperature is greater than the contemplated module temperature. Thus, as discussed further herein, the fluid should be cycled efficiently through the module 100 in order to ensure that the second temperature of the fluid nears the module temperature. In a preferred embodiment, the second temperature of the fluid is raised to the module temperature upon reaching the output port 106 of the module 100.

According to an inventive aspect of the present invention, the channel 108 is therefore preferably designed to pass the fluid therethrough such that a given control volume of fluid entering the input port 104 of the module 100 at the first temperature is raised to the second temperature while being conveyed through the channel 108 toward the output port 106. The given control volume of fluid should reach the second temperature immediately prior to exiting the output port 106 of the module 100. In this regard, the fluid is preferably uniformly heated as it passes through the module 100, without leaving fluid undercirculated or overcirculated, as problematic from the prior art. The first temperature of the fluid may be selected at ambient temperature or lower. The greater difference in the first temperature of the fluid and the module temperature, the greater the heat absorption capability of the fluid. In such a scenario, the fluid could consistently absorb a given amount of heat. Thus, the fluid exiting through the output port 106 should consistently be raised to the second temperature. Optimal first and second temperatures may be determined based on the heat capacity and other characteristics of the fluid, as well as the thermal characteristics of the heat generating component.

For example, a given volume of fluid entering the input port 104 should pass through the entirety of the channel 108 without reaching the temperature of the module 100 itself. As the volume of fluid passes through the channel 108 along the fluid path, the module 100 may continuously transfer heat to the volume of fluid. As mentioned above, the fluid is preferably selected according to system requirements such that the fluid has an appropriate thermal capacity. Thus, in designing the fluid path of the channel 108, the given volume of fluid should preferably be able to absorb equal amounts of heat from the module at any given point within the channel 108. Thus, the module may transfer equal amounts of heat at multiple points along the fluid path of the channel 108. Ensuring that the fluid path of the channel 108 and the heat absorption capacity of the fluid allow for constant dissipation of heat to the fluid will tend to also ensure that the module is able to continuously and steadily absorb and dissipate heat from the heat generating component.

As illustrated in FIG. 5, the channel 108 also preferably defines a singular, non-diverging flow path, starting at the input port 104 and ending at the output port 106. A singular flow path 122 tends to ensure that the fluid is consistently and uniformly heated as it travels through the channel 108. Further, the singular flow path 122 may also tend to ensure an even temperature distribution in the module 100. Otherwise, if certain areas of the module 100 are not being cooled, it is likely that the corresponding areas of the heat generating component are not being cooled and are thus subject to instability and/or failure. Thus, as described herein, with the singular flow path 122, the fluid would not tend to be undercirculated or overcirculated through the module 100, which was a problematic aspect of the prior art apparatuses. In cases of undercirculated fluid, the second temperature of the fluid would not be close to the module temperature. In cases of overcirculated fluid, the fluid would reach the module temperature while still circulating in the channel 108. Thus, as taught herein, the second temperature of the fluid should preferably reach the module temperature upon exiting the output port 106 of the module 100. Thus, the fluid will have reached its heat absorption capacity and will have been immediately evacuated from the module 100.

Additionally, it is contemplated that in some embodiments, the channel 108 may also diverge into a plurality of flow paths 122 in order to circulate the fluid within the module 100 and then to converge at the output port 106 to return the fluid. Such divergence of the flow path 122 should be limited to configurations that do not adversely affect the uniform heating and circulation of the fluid.

Finally, the channel 108 may be plated with a thermally conductive material, which may enhance the transfer of heat to the fluid. In particular, the fluid path of the channel 108 should preferably allow the module 100 to continue to transfer heat to the fluid until the fluid exits through the output port 106.

Figure 8:
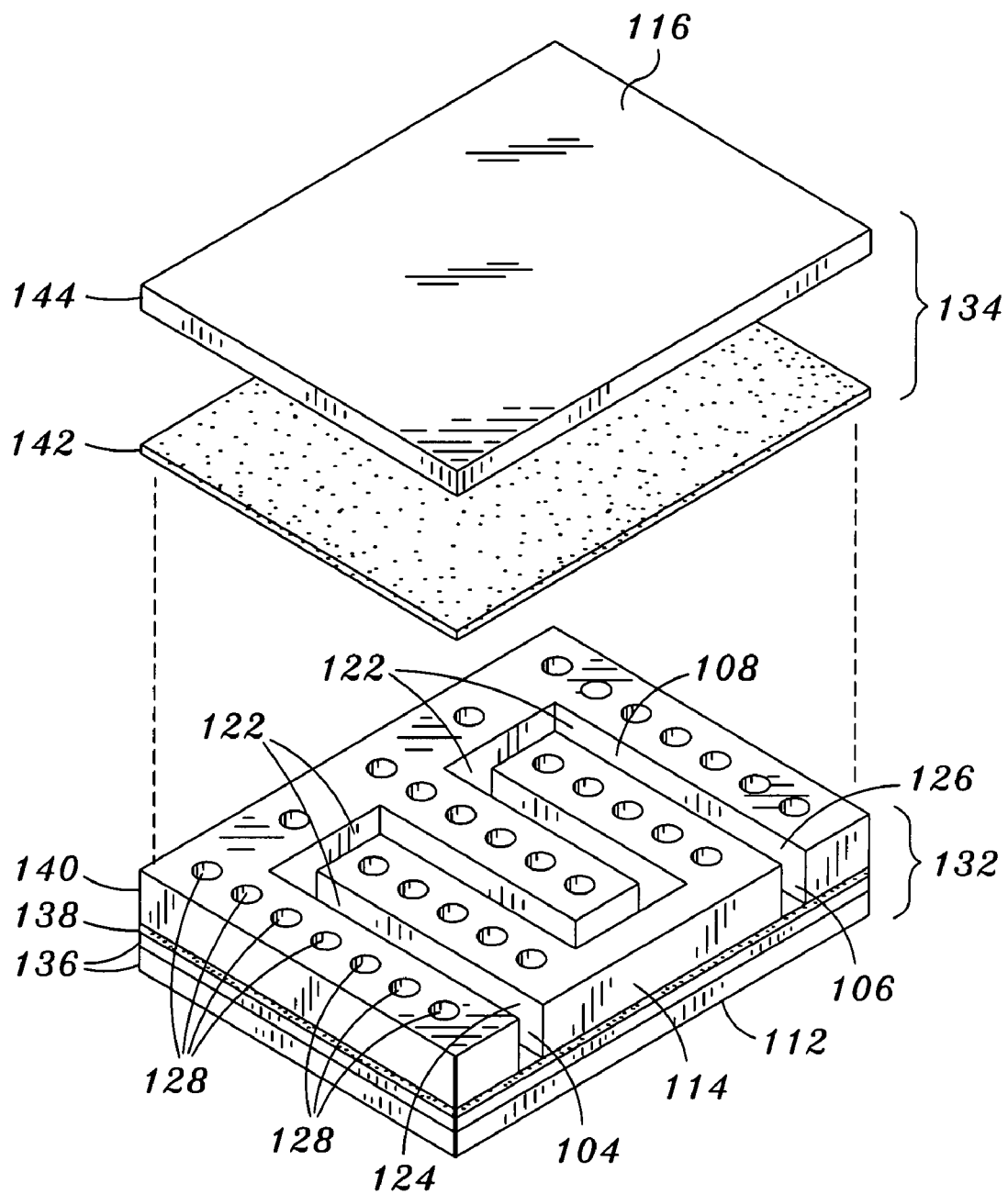
FIG. 8 is an exploded perspective view illustrating the layerwise configuration and fabrication of a second subassembly of the liquid cooled module and the formation of a channel within the first subassembly in accordance with an aspect of the present invention.

In accordance with another aspect of the present invention, as shown in FIGS. 4 and 5, the module further comprises at least one cooling hole 128 disposed through the top surface 112 at least partially through the module body 102 toward the base 110 of the module 100. The cooling hole 128 defines an interior surface 130. The interior surface 130 thereof is in fluid communication with ambient air to enhance heat dissipation from the module 100. Further, a plurality of cooling holes 128 may be arranged in a pattern corresponding to the flow path 122 of the channel 108. In this regard, the pattern should preferably be configured with the cooling holes 128 not intersecting with the flow path 122 of the channel 108, as shown in FIGS. 4 and 8. Additionally, the cooling hole 128 may be plated with a heat conductive material, which may also enhance the heat dissipation of the module 100. Finally, while it is contemplated that the cooling holes 128 may be a preferred embodiment, the module 100 may also be configured to include a plurality of fins, shaped as pins or parallel spaced-apart plates, in order to further increase the surface area and heat dissipation from the module 100.

Figure 6:
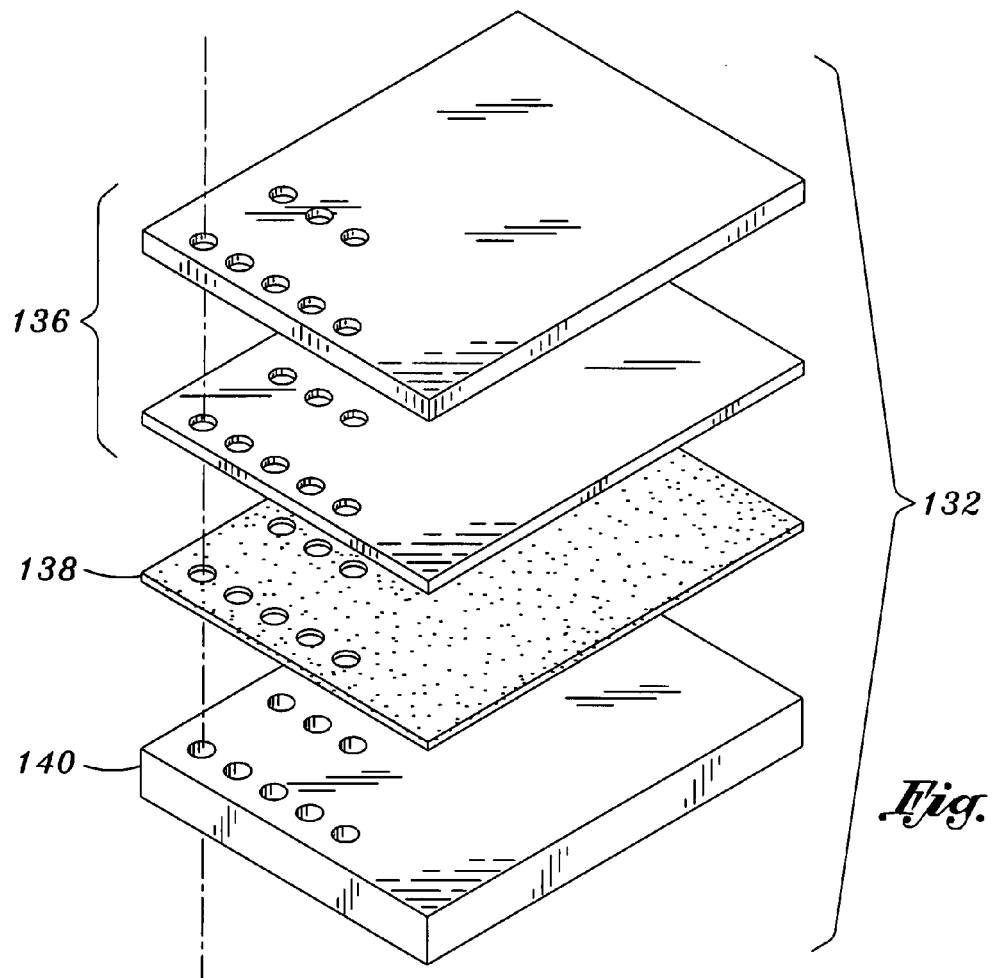
FIG. 6 is an exploded perspective view illustrating the layerwise configuration and fabrication of a first subassembly of the module in accordance with an aspect of the present invention.

Referring now to FIGS. 6-8, a preferred embodiment of the module 100 is illustrated in an exploded views to illustrate layerwise construction of the module 100. As shown therein, the module 100 may be divided into multiple layers that are adhesively attached to one another. According to an aspect of the present invention, the module 100 preferably includes first and second subassemblies 132, 134. The first subassembly 132 preferably includes first, second, and third layers 136, 138, 140. The second layer 138 adhesively attaches the first layer 136 to the third layer 140. The first and third layers 136, 140 may each be fabricated from a single sheet of material, such as a copper sheet. The first layer 136 may further be comprised of a copper sheet that is adhesively attached to a circuit board. As shown in FIG. 6 then, the first, second, and third layers 136, 138, 140 may be arranged as a circuit board and a thin layer of prepreg glass or acrylic adhesive disposed intermediate two layers of copper. In this embodiment, the first layer 136 is a copper sheet of two ounces or 0.003" in thickness and a circuit board made of fiberglass or polyimide having a thickness of 0.002". The second layer 138 preferably comprises prepreg or acrylic adhesive having a thickness of 0.002". Finally, the third layer 140 is a copper sheet having a thickness of 0.010".

As illustrated in FIG. 6, the first layer 136 defines the top surface 112, and the third layer 140 includes the channel 108 that is disposed therein. The channel 108 may be formed in the third layer 140 using one or many of a variety of manufacturing techniques described below. Upon formation, the channel 108 will define the flow path 122 and include the inlet and outlet ends 124, 126. The first subassembly 132 also defines the side surface 114. Further, the input and output ports 104, 106 are disposed on the side surface 114 of the first subassembly 132. The input and output ports 104, 106 are in fluid communication with the respective ones of the inlet and outlet ends 124, 126 of the channel 108.

As mentioned above, according to an embodiment of the present invention, the module 100 may be configured to include the plurality of cooling holes 128 in addition to the channel 108. Thus, the module 100 may be able to more efficiently transfer heat away from the heat generating component through utilization of the plurality of cooling holes 128, which increases the surface area of the module 100, thereby increasing the rate at which heat is dissipated from the module 100. In order to form the plurality of cooling holes 128, the first subassembly 132 is combined in layerwise fashion, as shown in FIG. 7. After the first, second, and third layers 136, 138, 140 are combined to form the first subassembly 132, the plurality of cooling holes 128 may be drilled through each of the first, second, and third layers 136, 138, 140 of the first subassembly 132. The cooling holes 128 may be formed through processes such as drilling, punching, or other processes known in the art. The cooling holes 128, if incorporated into the final module 100, should preferably be formed prior to formation of the channel 108, which is described below.

After the cooling holes 128 have been formed, layer three 140 of the subassembly may then be processed to form the channel 108 therein. The channel 108 may be formed through processes such as etching, routing, chemical milling, machining, or other such processes. As shown in FIG. 7, the channel 108 is preferably formed only through the third layer 140, and therefore should not extend into layers one or two 136, 138. However, it is possible that the second layer 138, which is an adhesive layer, may be removed during the formation of the channel 108 within the third layer 140. However, the formation of the channel 108 within the third layer 140 should be performed with great caution in order to ensure that the channel 108 does not extend into the first layer 136. Furthermore, the channel 108 should not intersect with any of the cooling holes 128 in order to ensure the integrity of the channel 108 and fluid flow therein. If the channel 108 were to intersect with any of the holes 128, the fluid may escape from the channel 108 through one of the holes 128 and leak out of the module 100.

Upon completion of the processing of the first subassembly 132, a second subassembly 134 is added to layer four 142 according to the pattern illustrated in FIG. 5. The second subassembly 134 includes fourth and fifth layers 142, 144. The fourth layer 142 adhesively attaches the fifth layer 144 to the third layer 140 of the first subassembly 132 to encapsulate the channel 108 thereby. The fourth layer 142 that may be a prepreg glass or acrylic adhesive and the fifth layer 144 may be made of polyimide or fiber glass. In particular, the fourth layer 142 may be formed of a thin layer of prepreg glass having a thickness of 0.002" or a thin layer of acrylic adhesive having a thickness of 0.001". The fifth layer 144 may be formed of a polyimide wafer having a thickness of 0.002" or a fiberglass wafer having a thickness of 0.010". The fifth layer 144 defines the base surface 116, which is disposable adjacent the heat generating component to facilitate transfer of the heat from the heat generating component to the fifth layer 144. The channel 108 is operative to convey a cooling fluid therethrough for absorbing and dissipating the heat from the heat generating component.

Thus, the module 100 may be formed in a laminated fashion with the first layer 136 and the fifth layer 144 becoming the respective top surface 112 and base surface 116 of the module 100. After the assembly of the layers, the input connector 26 and the output connector 28 may be attached to the respective ones of the input port 22 and the output port 24. Further, the input and output tubes may be connected to the respective ones of the input port 104 and the output port 106. Finally, the module 100 may be placed with the base surface 116 being in thermal contact with the heating generating component. Thus, the module 100 may then be placed with the base surface 116, i.e., the fifth layer 144, in thermal contact with the heat generating component.

Therefore, as disclosed herein, embodiments of the present invention may utilize a layerwise production method to create the module 100. One of the unique aspects of the layerwise production method is that the channel 108 is selectively formed while the material of the third layer 140 is adhered to layers three and two 140, 138. This unique aspect of embodiments of the present invention provides stability to the third layer 140 during formation of the channel 108. Indeed, it would be difficult to create the channel 108 in the third layer 140 prior to adhering the third layer 140 to the first 136 and second layers 138. As shown in FIG. 8, after being formed, the channel 108 divides the third layer 140 into inner and outer portions that mate to define the channel 108 therebetween. This division of the third layer 140 upon formation of the channel 108 would make subsequent lamination of the third layer 140 to the first and second layers 136, 138 quite difficult. Thus, the formation of a channel 108 of relatively complex geometry is made easier and may be done more reliably. Further, the layerwise production method also enables the module 100 to be fabricated of materials having differing thermal properties throughout, which allows flexibility in designing and selecting materials for use in the module 100 and in turn allows the fabrication of a more effective and efficient heat absorber and diffuser.

After the channel 108 is formed in the third layer 140, as described herein, the channel 108 may also be plated to provide certain chemical and physical properties to the channel 108 thereby allowing a desirable fluid, such as gas or a liquid coolant to pass therethrough. In this regard, it is contemplated that upon selecting a given fluid to be used to cool the module 100, a plating material having desirable physical and/or chemical properties may be accordingly selected to provide longevity, stability, and good wear life to the channel 108. Further, the use of a plating material may also ensure that the fluid flow through the channel 108 tends to be more laminar than turbulent, as described above. For example, if the channel 108 is etched or chemically milled, the cross-section of the channel 108 may tend to be more rectangular in nature, having sharp corners where turbulent flow of the fluid may occur. Thus, by utilizing the plating material to plate the channel 108, the fluid may flow more laminarly through the channel 108 thus tending to improve the cooling efficiency of the module 100 and the fluid used therein. Finally, the plating material should preferably have a high thermal conductivity in order to properly conduct heat from the module 100 to the fluid therein.

As described above, the formation of the channel in the third layer 140 may be created through various processes such as chemical milling, etching, machining, casting, routing, just to name a few. For example, upon formation of the first subassembly 132: the first subassembly 132 may be coated with a photo-resist; the design of the channel 108 may be etched or cut into the photo-resist (as by laser) and peeled off to expose certain aspects of the first subassembly 132; and the entire first subassembly 132 may then be immersed in a chemical bath with only the exposed portion of the first subassembly 132, which may be the channel 108, being exposed to the chemical bath. Other modifications of the process may be performed accordingly.

Additionally, according to another embodiment of the present invention, it is contemplated that the first subassembly 132 may be at least partially formed through injection molding techniques. In this regard, the material utilized to form the first subassembly 132 may be selected from plastics, composites, or metals that are susceptible to injection molding. In addition to forming the channel 108 through an injection molding technique, it is also contemplated that the plurality of holes describe above may also be formed utilizing the injection molding technique. For example, the first, second, and third layers 136, 138, 140 may be replaced by a single injection molded channel portion. Upon completion of the channel 108 portion, a thermally conductive layer, such as the second subassembly 136 described above, may be adhered to an upper face of the channel 108 portion, thereby enclosing the channel 108. Therefore, depending on user requirements, as well as the physical and chemical properties of the materials used to create the module 100, as well as the properties of the fluid used therein, the module 100 may be fabricated utilizing other methods such as injection molding.

Figure 1:
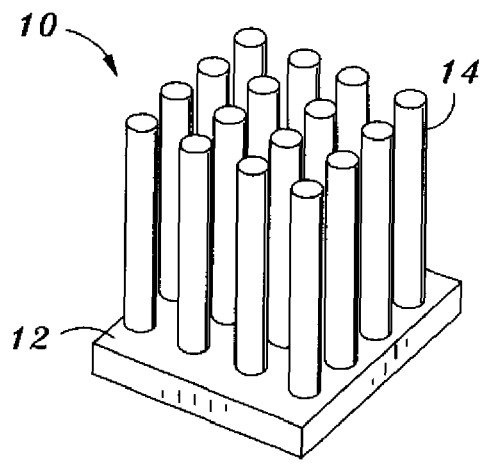
FIG. 1 is a perspective view of a prior art heat sink apparatus including fins in the shape of pins.
Figure 2:
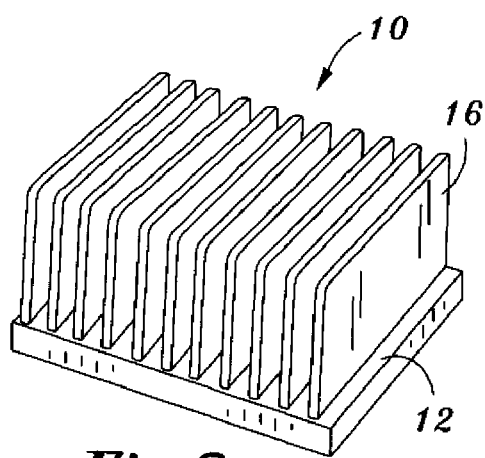
FIG. 2 is a perspective view of a prior art heat sink apparatus including fins in the shape of spaced-apart plates.

As described above, the plurality of cooling holes 128 may be designed according to user requirements. As will be understood, the cooling holes 128 may be utilized in conjunction with the teachings herein to enhance the heat dissipation ability of the module 100. As similarly mentioned with respect to prior art heat sink 10 shown in FIG. 1, the formation of the cooling holes 128 within the module 100 increases the surface area of the module 100 and enhances the ability of the module 100 to dissipate heat through radiation. Nevertheless, as also mentioned, it is also contemplated that a plurality of fins, such as pin-like projections, may be selectively mounted onto at least the top surface 112 of the module 100, preferably the top surface 112 of the module 100 of the embodiment of the module 100 shown in FIG. 4. In such a configuration, the plurality of pin-like projections may be utilized to conduct heat away from the bottom surface of the module 100. In addition, a fan may be used to force air through the pin-like projections thereby aiding in the removal of heat from the module 100. The pin-like projections may also be replaced by a series of spaced apart plates, as shown in FIG. 2, or other such projections that are utilized to conduct heat away from the top surface. Nevertheless, as discussed above, such modifications preferably permit the module 100 to be placed within narrow and compact confines of an electronics device. As such, the use of projections such as the pins or plates described above, may be limited to more discrete configurations that nevertheless are capable to remove heat and increase the surface area of the module 100.

Additionally, it is also contemplated that the channel 108 may be planar as illustrated in FIGS. 5 and 8. However, it is also contemplated that the channel 108 may be formed with a three-dimensional flow path 122, rather than limiting the flow path 122 as being planar. In this regard, it is contemplated that through various forming operations and techniques, the channel 108 may be formed in a variety of configurations.

In addition to the forming operations discussed above, it is also contemplated that the module 100 may be formed utilizing selective plating technology. In this regard, the channel 108, the plurality of holes, and/or other geometric components which comprise the module 100 may be formed utilizing the electromechanical process of selective plating. Selective plating may be advantageously used considering its significant advantages over conventional plating processes and the precision with which the thicknesses, dimensions, and other properties such as excellent adhesion, fine grained density, low porosity, and others.

In use, the module 100 is placed adjacent the heat generating component. The module 100 may be secured adjacent the heat generating component through the use of conventional adhesives, mechanical fasteners, or other such methods. For example, the module 100 may be adhered to the heat generating component utilizing a heat conductive adhesive or grease. Further, the module 100 may also be formed to include a plurality of fastener holes through which fasteners such as bolts or screws may be disposed. As such, the fasteners may likewise pass through corresponding mounting holes in or around the heat generating component, typically around a substrate on which the heat generating component is placed.

After the module 100 is properly secured to the heat generating component, the module 100 may be used to circulate the cooling fluid therein. As such, the input and output tubing must be connected to respective input and output fittings on a cooling tower, such as a refrigerated compressor, a coolant reservoir or thermo composite cooling tower. Therefore, once the module 100 is in use, the fluid passes from the cooling tower to the input port 104 of the module 100, cycles through the input port 104 of the module 100 to remove heat from the module 100 as it passes through the channel 108, exits the output port 106 of the module 100, and returns to the cooling tower to dissipate the heat passed to the fluid while passing through the module 100.

The above description is given by way of example, and not limitation. Given the above disclosure, one skilled in the art could devise variations that are within the scope and spirit of the invention disclosed herein, including selecting various materials and module configurations that optimize the fluid flow, thermal properties, and/or other attributes of the module that allow the module to be more useful in compact devices. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A thermal module for absorbing and dissipating heat from a heat generating component, the module comprising:
   a module body including a thermally conductive base, a top surface, and a side surface rising from the base toward the top surface, the base being disposable adjacent the heat generating component to facilitate transfer of heat from the heat generating component to the base;
   at least one cooling hole disposed through the top surface at least partially through the module body toward the base of the module, the cooling hole defining an interior surface, the interior surface thereof being in fluid communication with ambient air to enhance heat dissipation from the module;
   input and output ports each being disposed on the side surface of the body; and
   a channel extending from the input port to the output port to define a flow path, the channel including an inlet end being in fluid communication with the input port, the channel further including an outlet end being in fluid communication with the output port, the channel being encapsulated within the body intermediate the base and the top surface, the channel being operative to convey a cooling fluid therethrough for absorbing and dissipating the heat from the heat generating component.

2. The module of claim 1 wherein the flow path is oriented parallel with respect to an upper face of the heat generating component.

3. The module of claim 1 wherein the flow path of the channel is oriented parallel with respect to an upper face of the heat generating component.

4. The module of claim 1 wherein the flow path of the channel is curvilinear to promote smooth flow of a fluid from the input port to the output port.

5. The module of claim 1 wherein the flow path of the channel is singular.

6. The module of claim 1 wherein the channel is plated with a thermally conductive material.

7. The module of claim 1 wherein a plurality of cooling holes are arranged in a pattern corresponding to the flow path of the channel, the pattern being configured with the cooling holes not intersecting with the flow path of the channel.

8. The module of claim 1 wherein the cooling hole is plated with a heat conductive material.

9. The module of claim 1 wherein the body is a rectangular parallelepiped.

10. A thermal module for absorbing and dissipating heat from a heat generating component, the module comprising:
 a first subassembly including first, second, and third layers, the second layer adhesively attaching the first layer to the third layer, the first layer defining a top surface, the third layer including a channel being disposed therein, the channel defining a flow path and including inlet and outlet ends, the first subassembly defining a side surface;
 at least one cooling hole disposed through the top surface and extending substantially through the first subassembly, the cooling hole defining an interior surface, the interior surface being in fluid communication with ambient air to enhance heat dissipation from the module;
 input and output ports being disposed on the side surface of the first subassembly, the input and output pods being in fluid communication with the respective ones of the input and output ends of the channel; and
 a second subassembly including fourth and fifth layers, the fourth layer adhesively attaching the fifth layer to the third layer of the first subassembly to encapsulate the channel thereby, the fifth layer defining a base surface, the base surface being disposable adjacent the heat generating component to facilitate transfer of the heat from the heat generating component to the fifth layer, the channel being operative to convey a cooling fluid therethrough for absorbing and dissipating the heat from the heat generating component.

11. The module of claim 10 wherein the channel is plated with a thermally conductive material.

12. The module of claim 10 wherein the third layer includes inner and outer portions mating to define the channel therebetween.

13. The module of claim 10 wherein the first, third, and fifth layers is fabricated from a single sheet of material.

14. The module of claim 13 wherein the single sheet of material included in the first and third layers is made of copper.

15. The module of claim 13 wherein the single sheet of material included in the fifth layer is made of one of polyimide and fiberglass.

16. A method of fabricating a thermal module for absorbing and dissipating heat from a heat generating component, the method comprising:
 laminating first, second, and third layers to form a first subassembly, the second layer adhesively attaching the first layer to the third layer, the first layer defining a top surface, the first subassembly defining a side surface;
 creating a channel within the third layer, the channel defining a flow path and including inlet and outlet ends, the inlet and outlet ends intersecting with the side surface of the first subassembly to form respective ones of input and output ports, the input and output ports being in fluid communication with the respective ones of the input and output ends of the channel;
 drilling at least one cooling hole through the first subassembly prior to laminating the second subassembly to the third layer of the first subassembly, the cooling hole not intersecting with the channel; and
 laminating fourth and fifth layers of a second subassembly to the third layer of the first subassembly, the fourth layer adhesively attaching the fifth layer to the third layer of the first subassembly to encapsulate the channel thereby.

17. The method of claim 16 further comprising the step of plating the cooling hole with a thermally conductive material.

18. The method of claim 16 further comprising the step of plating the channel with a thermally conductive material.

* * * * *